(12) United States Patent
Wen

(10) Patent No.: US 9,638,976 B2
(45) Date of Patent: May 2, 2017

(54) LIQUID CRYSTAL DISPLAY DEVICE, THIN FILM TRANSISTOR ARRAY SUBSTRATE AND METHOD OF FABRICATING THE SAME

(71) Applicants: Xiamen Tianma Micro-Electronics Co., Ltd., Xiamen (CN); Tianma Micro-Electronics Co., Ltd., Shenzhen (CN)

(72) Inventor: Liang Wen, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

(*) Notice: Subject to any disclaimer, the term of this patent is extended or adjusted under 35 U.S.C. 154(b) by 36 days.

(21) Appl. No.: 14/788,710

(22) Filed: Jun. 30, 2015

(65) Prior Publication Data
US 2016/0187688 A1 Jun. 30, 2016

(30) Foreign Application Priority Data
Dec. 30, 2014 (CN) .......................... 2014 1 0844512

(51) Int. Cl.
*G02F 1/1333* (2006.01)
*G02F 1/1368* (2006.01)
*H01L 27/12* (2006.01)
*H01L 29/417* (2006.01)
(Continued)

(52) U.S. Cl.
CPC .......... *G02F 1/1368* (2013.01); *G02F 1/1333* (2013.01); *G02F 1/1339* (2013.01); *G02F 1/133345* (2013.01); *H01L 27/124* (2013.01); *H01L 27/1248* (2013.01); *H01L 27/1288* (2013.01); *H01L 27/1296* (2013.01); *H01L 29/41733* (2013.01); *G02F 1/13394* (2013.01); *G02F 1/136227* (2013.01)

(58) Field of Classification Search
CPC .................................................. G02F 1/133512
See application file for complete search history.

(56) References Cited

U.S. PATENT DOCUMENTS

| | | | |
|---|---|---|---|
| 2009/0065780 A1* | 3/2009 | Yasukawa | H01L 29/42384 257/71 |
| 2011/0096259 A1* | 4/2011 | Lee | G02B 5/201 349/41 |
| 2015/0002774 A1* | 1/2015 | Choi | G03F 7/203 349/43 |

FOREIGN PATENT DOCUMENTS

| KR | 10-20080038513 A | 5/2008 |
|---|---|---|
| KR | 10-1350260 B1 | 1/2014 |

* cited by examiner

*Primary Examiner* — Phu Vu
(74) *Attorney, Agent, or Firm* — Alston & Bird LLP

(57) ABSTRACT

The invention discloses a liquid crystal display device, a thin film transistor array substrate and a method of fabricating the same. The thin film transistor array substrate includes: a substrate including a plurality of photo-sensitive spacer areas, a plurality of thin film transistors arranged on the substrate, each of which includes a source and a drain, and a first planarizing layer overlying the plurality of thin film transistors. Multiple planarizing layer openings are arranged in the first planarizing layer in areas corresponding to the drains of the thin film transistors; a pixel electrode layer is arranged on the first planarizing layer and in contact with the drains; and a second planarizing layer is arranged on the pixel electrode layer and fills the planarizing layer openings.

10 Claims, 11 Drawing Sheets

(51) Int. Cl.
*G02F 1/1339* (2006.01)
*G02F 1/1362* (2006.01)

LIQUID CRYSTAL DISPLAY DEVICE, THIN FILM TRANSISTOR ARRAY SUBSTRATE AND METHOD OF FABRICATING THE SAME

CROSS-REFERENCES TO RELATED APPLICATIONS

This application claims the benefit of priority to Chinese Patent Application No. 201410844512.6, filed with the Chinese Patent Office on Dec. 30, 2014 and entitled "LIQUID CRYSTAL DISPLAY DEVICE, THIN FILM TRANSISTOR ARRAY SUBSTRATE AND METHOD OF FABRICATING THE SAME", the content of which is incorporated herein by reference in its entirety.

FIELD OF THE INVENTION

The present invention relates to liquid crystal display technology, and more particularly to a liquid crystal display device, a thin film transistor array substrate and a method of fabricating the same.

BACKGROUND OF THE INVENTION

In a Liquid Crystal Display (LCD), a liquid crystal layer is typically arranged between a thin film transistor array substrate and a color filter substrate. In order to bond the thin film transistor array substrate and the color filter substrate together, photo-sensitive spacers for supporting need to be arranged between the two substrates to thereby control the thickness of the liquid crystal layer. Moreover the photo-sensitive spacer can be also arranged so that the LCD can resume its original shape upon being pressed by an external force so as to be protected.

FIG. 1 illustrates a top view of a liquid crystal display in the prior art. As can be seen, photo-sensitive spacers 111 are arranged at the locations where a vertical black matrix 105 crosses a horizontal black matrix 106. In FIG. 1, data lines 102 are arranged parallel to the vertical black matrix 105, and scan lines 103 are arranged parallel to the horizontal black matrix 106. The area surrounded by the data lines 102 and the scan lines 103 is referred to as pixel display area in which a pixel electrode layer 104 is arranged.

FIG. 2 illustrates a sectional view of a liquid crystal display in the prior art. A color filter substrate 107 and a thin film transistor array substrate 108 are arranged opposite to each other, and the surface of the thin film transistor array substrate 108 is covered with a planarizing layer 109 in which the planarizing layer openings 110 are arranged. The pixel electrode layer 104 overlying the planarizing layer 109 can be metal-contact with drains 113 covered by the planarizing layer 109 due to the planarizing layer opening 110. The photo-sensitive spacers 111 and sub-photo-sensitive spacers 112 are arranged between the thin film transistor array substrate 108 and the color filter substrate 107 for protection and support. In the prior art, fixed ends of the photo-sensitive spacers 111 and the assisting photo-sensitive spacers 112 are arranged on the inside of the color filter substrate 107, and free ends of the photo-sensitive spacers 111 and the sub-photo-sensitive spacers 112 are arranged facing the inside of the thin film transistor array substrate 108.

The photo-sensitive spacers 111 are arranged between two adjacent planarizing layer openings 110 on the thin film transistor array substrate 108, typically above gates 114. As the pixel density of the liquid crystal display is increased, the space between the planarizing layer openings 110 becomes smaller, and the planarizing layer 109 becomes less planar. At this time when an external force is applied to the liquid crystal display, the photo-sensitive spacers 111 are arranged on non-planar locations and thus tend to be curved so that the liquid crystal display may be deformed, or the photo-sensitive spacers 111 may slip into the planarizing layer openings 110 so that the liquid crystal display may have color cast problems, light leakage and other technical issues.

BRIEF SUMMARY OF THE INVENTION

An embodiment of the invention provides a method of fabricating a thin film transistor array substrate. The method includes: providing a substrate including multiple photo-sensitive spacer areas and multiple planarizing layer opening areas, the photo-sensitive spacer areas being in close proximity to the planarizing layer opening areas; forming a plurality of thin film transistors on the substrate, each of the plurality of thin film transistors includes a source and a drain; forming a first planarizing layer on the plurality of thin film transistors to overlie the plurality of thin film transistors, and etching the first planarizing layer to form planarizing layer openings in the first planarizing layer corresponding to the planarizing layer opening areas, the planarizing layer opening areas correspond to drains and the planarizing layer openings expose the drains; forming a pixel electrode layer on the first planarizing layer, the pixel electrode layer is in contact with the drains through the planarizing layer openings; forming a second planarizing layer on the pixel electrode layer, the second planarizing layer filling the planarizing layer openings; and exposing the second planarizing layer using a mask and developing the exposed second planarizing layer to remove the second planarizing layer in the photo-sensitive spacer areas while leaving the second planarizing layer in the planarizing layer openings.

An embodiment of the invention further provides another method for fabricating a thin film transistor array substrate, the method including: preparing a substrate including photo-sensitive spacer areas and planarizing layer opening areas, the photo-sensitive spacer areas being in close proximity to the planarizing layer opening areas; forming a plurality of thin film transistors on the substrate, each of the plurality of thin film transistors comprises a source and a drain, forming a first planarizing layer on the plurality of thin film transistors to overlie the plurality of thin film transistors; etching the first planarizing layer to form planarizing layer openings in the first planarizing layer corresponding to the planarizing layer opening areas, the planarizing layer opening areas correspond to drains and the planarizing layer openings expose the drains; forming a pixel electrode layer on the first planarizing layer, the pixel electrode layer is in contact with the drains through the planarizing layer openings; and forming a second planarizing layer on the pixel electrode layer to fill the planarizing layer openings and to overlie the first planarizing layer.

An embodiment of the invention further provides another method of fabricating a thin film transistor array substrate, the method including: providing a substrate including photo-sensitive spacer areas and planarizing layer opening areas, the photo-sensitive spacer areas being in close proximity to the planarizing layer opening areas; forming a plurality of thin film transistors on the substrate, each of the plurality of thin film transistors includes a source and a drain; forming a first planarizing layer on the plurality of thin film transistors to overlie the plurality of thin film transistors; etching the first planarizing layer to form planarizing layer openings in the first planarizing layer corresponding to the planarizing layer opening areas, the planarizing layer opening areas correspond to drains and the planarizing layer openings expose the drains; forming a pixel electrode layer on the first planarizing layer, the pixel electrode layer is in contact with the drains through the planarizing layer openings; forming a second planarizing layer on the pixel electrode layer, second planarizing layer filling the planarizing layer openings and with a thickness equal to a height of photo-sensitive spacers; and exposing the second planarizing layer using a mask to leave the second planarizing layer in the photo-sensitive spacer areas, and forming photo-sensitive spacers by the second planarizing layer in the photo-sensitive spacer areas.

An embodiment of the invention further provides a thin film transistor array substrate. The thin film transistor array substrate includes: a substrate including photo-sensitive spacer areas and planarizing layer opening areas, the photo-sensitive spacer areas being in close proximity to the planarizing layer opening areas; a plurality of thin film transistors arranged on the substrate, each of the plurality of thin film transistors comprises a source and a drain; a first planarizing layer arranged on the plurality of thin film transistors and overlying the plurality of thin film transistors, wherein planarizing layer openings are arranged in the first planarizing layer corresponding to the planarizing layer opening areas, the planarizing layer opening areas correspond to drains and the planarizing layer openings expose the drains; a pixel electrode layer arranged on the first planarizing layer and in contact with the drains; and a second planarizing layer arranged on the pixel electrode layer and filling the planarizing layer openings.

An embodiment of the invention further provides another thin film transistor array substrate. The thin film transistor array substrate includes: a substrate including photo-sensitive spacer areas and planarizing layer opening areas, the photo-sensitive spacer areas being in close proximity to the planarizing layer opening areas; a plurality of thin film transistors arranged on the substrate, each of the plurality of thin film transistors comprises a source and a drain; a first planarizing layer arranged on the plurality of thin film transistors and overlying the plurality of thin film transistors, wherein planarizing layer openings are arranged in the first planarizing layer corresponding to the planarizing layer opening areas, the planarizing layer opening areas correspond to drains and the planarizing layer openings expose the drains; a pixel electrode layer arranged on the first planarizing layer and in contact with the drains; and a second planarizing layer arranged on the pixel electrode layer, the second planarizing layer filling the planarizing layer openings and forming into photo-sensitive spacers in the photo-sensitive spacer areas.

An embodiment of the invention also provides a liquid crystal display device including the thin film transistor array substrate described above, and a color filter, the thin film transistor array substrate and the color filter substrate are sealed and arranged opposite to each other, and a liquid crystal layer is arranged between the thin film transistor array substrate and the color filter substrate, wherein the liquid crystal display device further includes photo-sensitive spacers arranged between the thin film transistor array substrate and the color filter substrate in the photo-sensitive spacer areas.

With the methods and devices according to the embodiments of the invention, the second planarizing layer is arranged on the first planarizing layer of the thin film transistor array substrate so that the planarizing layer openings are filled with the second planarizing layer to planarize the planarizing layer on the thin film transistor array substrate, so the photo-sensitive spacers can stand more stably instead of slipping into the planarizing layer openings, thus addressing the problems of color cast and light leakage in the liquid crystal display in the prior art due to the non-planar planarizing layer on the thin film transistor array substrate.

DETAILED DESCRIPTION OF THE INVENTION

First Embodiment

Figure 1:
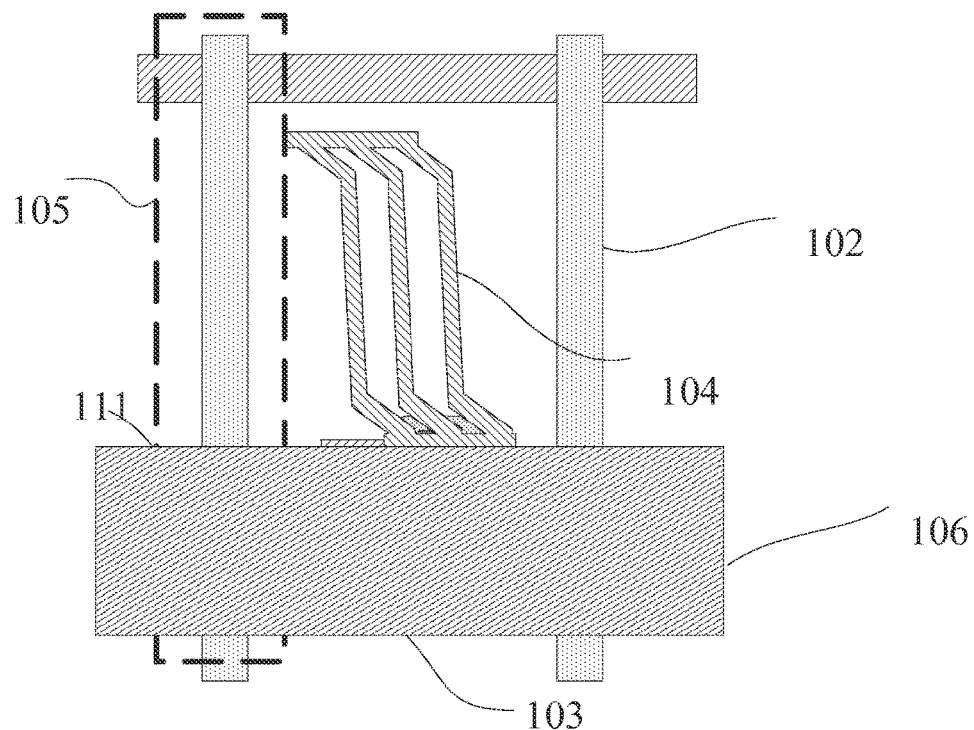
FIG. 1 illustrates a top plan view of a liquid crystal display in the prior art.
Figure 2:
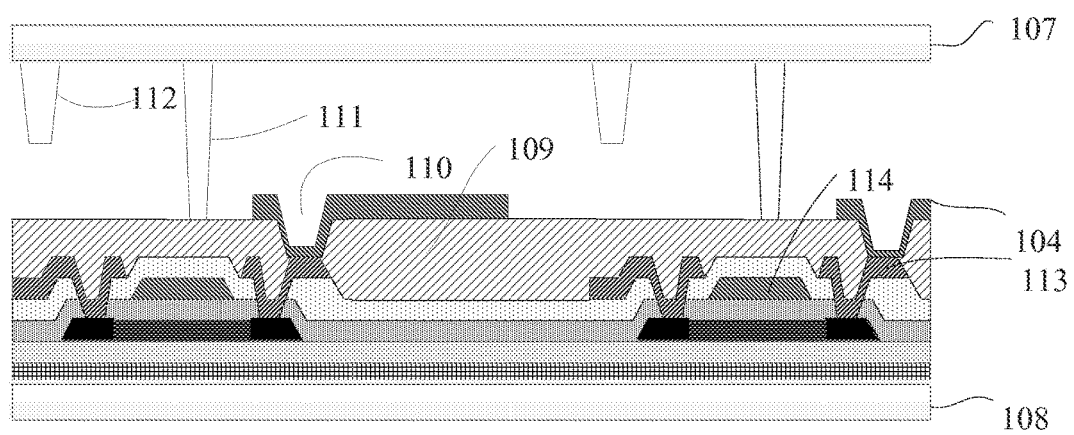
FIG. 2 illustrates a simplified sectional view of the liquid crystal display in the prior art.
Figure 3:
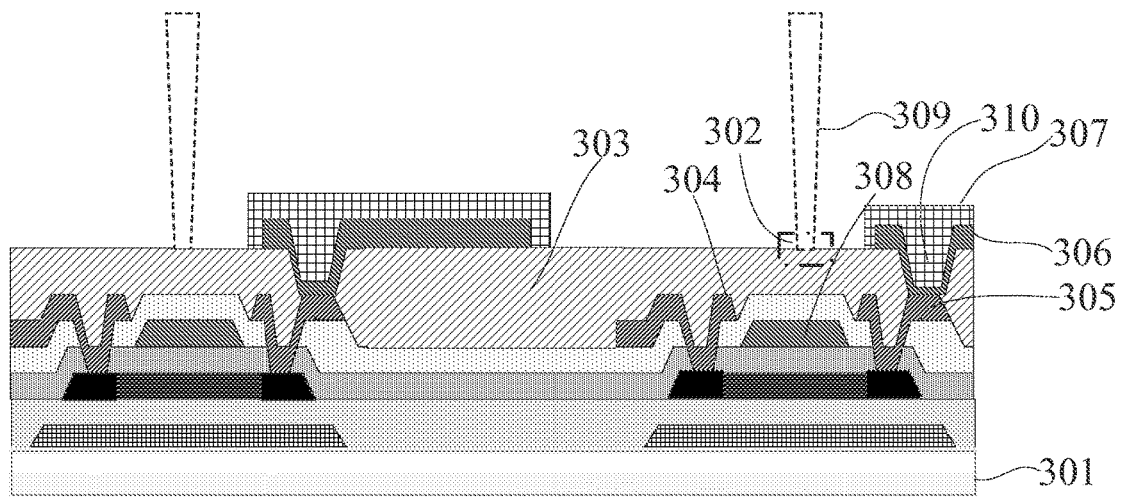
FIG. 3 illustrates a simplified sectional view of a thin film transistor array substrate according to a first embodiment of the invention.

As illustrated in FIG. 3, a first embodiment of the invention provides a thin film transistor array substrate, which includes: a substrate 301 including photo-sensitive spacer areas 302 and planarizing layer opening areas, the photo-sensitive spacer areas 302 being in close proximity to the planarizing layer opening areas, and a plurality of thin film transistors arranged on the substrate 301, each of the thin film transistors includes a source 304 and a drain 305; a first planarizing layer 303 arranged on the plurality of thin film transistors to overlie the plurality of thin film transistors; multiple planarizing layer openings 310 arranged in the first planarizing layer 303 corresponding to the planarizing layer opening areas, i.e., the drains 305, to expose the drains 305; a pixel electrode layer 306 arranged on the first planarizing layer 303 and in contact with the drains 305; and a second planarizing layer 307 arranged on the pixel electrode layer 306 to fill the planarizing layer openings 310. In FIG. 3, gates 308 are disposed between the sources 304 and the drains 305, and photo-sensitive spacers 309 are arranged in the photo-sensitive spacer areas 302 where the gates 308 are arranged. A liquid crystal display can include the thin film transistor array substrate according to the first embodiment of the invention, and the photo-sensitive spacers 309 function to support the thickness of a liquid crystal box of the liquid crystal display.

The substrate 301 can be made of glass, resin or another material but will not be limited thereto. The pixel electrode layer 306 can be made of indium tin oxide or another transparent metal oxide.

Figure 4:
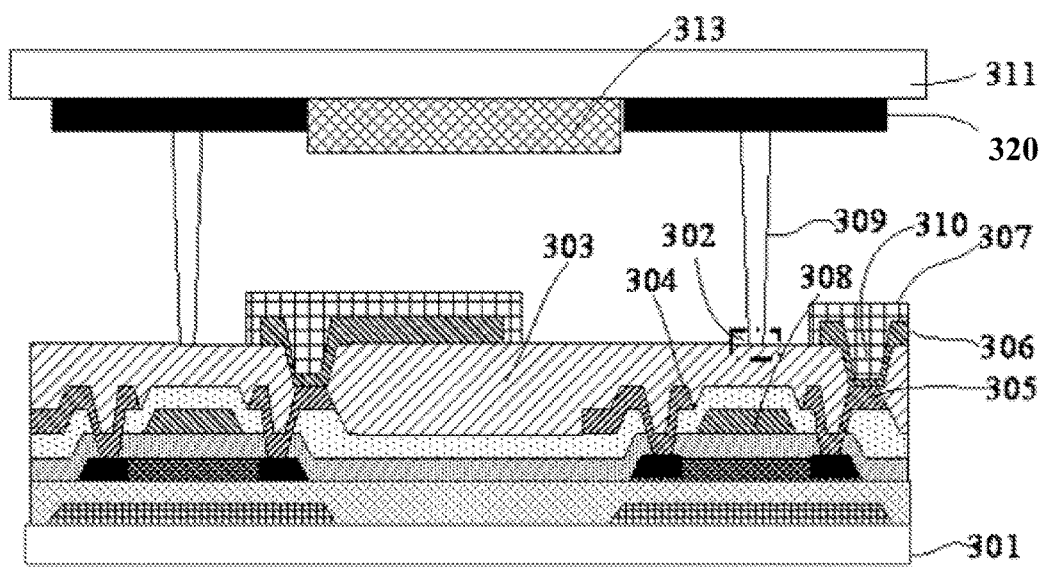
FIG. 4 illustrates a simplified sectional view of a liquid crystal display device according to the first embodiment of the invention.

As illustrated in FIG. 4, an embodiment of the invention further provides a liquid crystal display including the thin film transistor array substrate described above and a color filter substrate, both of which are sealed and arranged opposite to each other, and between which a liquid crystal layer is arranged. The color filter substrate includes a substrate 311, a black matrix 320 arranged below the substrate 311, and color resists 313 disposed in gaps between the black matrix 320. The color filter substrate further includes multiple photo-sensitive spacers 309, each of which includes a fixed end and a free end, the fixed ends of the photo-sensitive spacers 309 are connected with the color filter substrate and arranged below the black matrix 320, and the free ends of the photo-sensitive spacers 309 are arranged facing and in contact with the thin film transistor array substrate, and the free ends of the photo-sensitive spacers 309 are arranged in photo-sensitive spacer areas 302.

Optionally, in another embodiment of the invention, the photo-sensitive spacers can be arranged on the thin film transistor array substrate, that is, the fixed ends of the photo-sensitive spacers are connected with the thin film transistor array substrate, the free ends of the photo-sensitive spacers are arranged facing the color film substrate, and the fixed ends of the photo-sensitive spacers are arranged in the photo-sensitive spacer areas.

With the thin film transistor array substrate and the liquid crystal display according to the first embodiment of the invention, the planarizing layer openings are filled with the second planarizing layer so that the photo-sensitive spacers cannot slip into the planarizing layer openings when an external force is being applied thereon, so the stably standing photo-sensitive spacers can be fabricated to thereby address the problems of deformation, color cast, light leakage, etc., of the liquid crystal display due to the abnormally positioned photo-sensitive spacers.

It shall be noted that pixel electrodes in the thin film transistor array substrate and the liquid crystal display according to the embodiment of the invention can be slits arranged planar or can be planar electrodes or strip-shaped electrodes but will not be limited thereto. Moreover, the thin film transistor array substrate and the liquid crystal display according to the embodiment of the invention can further include other structures which are not illustrated in the figure, e.g., common electrodes which can be arranged on the inside of the color filter substrate or the inside of the thin film transistor array substrate and can be arranged above or below the pixel electrodes with an insulation layer being arranged between the common electrodes and the pixel electrodes, the invention will not be limited thereto. Moreover, a semiconductor layer of the thin film transistor array substrate and the liquid crystal display according to the embodiment of the invention can be an amorphous silicon, poly-silicon, oxide semiconductor or the like, the invention will not be limited thereto.

The first embodiment of the invention further provides a method of fabricating the thin film transistor array substrate above. Referring to FIG. 3, the method includes:

Step 1: provide a substrate 301 including photo-sensitive spacer areas 302 and planarizing layer opening areas, the photo-sensitive spacer areas 302 being in close proximity to the planarizing layer opening areas;

Step 2: form a plurality of thin film transistors on the substrate 301, each of which includes a source 304 and a drain 305;

Step 3: form a first planarizing layer 303 on the plurality of thin film transistors to overlie the plurality of thin film transistors, and etch the first planarizing layer 303 overlying areas of drains 305 to form planarizing layer openings 310 in the first planarizing layer 303 corresponding to the planarizing layer opening areas, the planarizing layer opening areas correspond to drains and the planarizing layer openings expose the drains 305;

Step 4: form a pixel electrode layer 306 on the first planarizing layer 303, the first planarizing layer 303 being in contact with the drains 305 through the planarizing layer openings 310;

Step 5: form a second planarizing layer on the pixel electrode layer 306, the second planarizing layer filling the planarizing layer openings 310; and Step 6: expose the second planarizing layer using a mask and develop the exposed second planarizing layer to form a portion of the second planarizing layer 307 in the planarizing layer openings 310, and remove the remaining of the second planarizing layer not in the planarizing layer openings 310.

The second planarizing layer 307 can be made of an organic material which can be a photo-sensitive material or a photo-resist material but will not be limited thereto.

It shall be noted that the embodiment of the invention further includes steps (processes) of forming other components, e.g., a process step of forming the common electrodes, and the process step of forming the common electrodes will not be limited in the embodiment of the invention; and since the process of forming the common electrodes is well known in the art, a description thereof will be omitted herein for the sake of brevity.

After the second planarizing layer is formed on the pixel electrode layer, the second planarizing layer is exposed using the mask so that the exposed second planarizing layer can overlie at least the planarizing layer openings. The mask for exposing the second planarizing layer can be a specific mask. However, preferably in order to save the cost of customizing the mask, the second planarizing layer can be exposed using a mask which is used for forming other parts in a process of fabricating the thin film transistor array substrate in the embodiment of the invention. The second planarizing layer can be exposed using a plurality of masks in the process of fabricating the thin film transistor array substrate, and this will be described below in details with respect to a plurality of embodiments thereof.

Second Embodiment

Figure 5A:
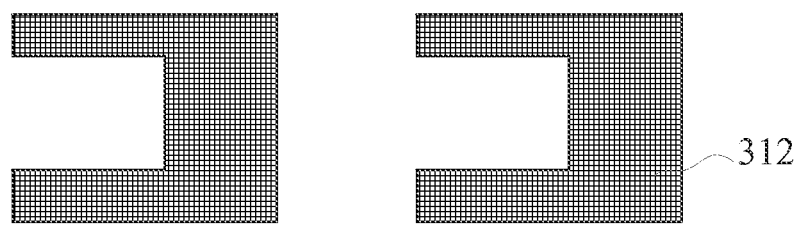
FIG. 5A to FIG. 5F illustrate top plan views of respective layers of a thin film transistor array substrate according to a second embodiment of the invention.
Figure 5B:
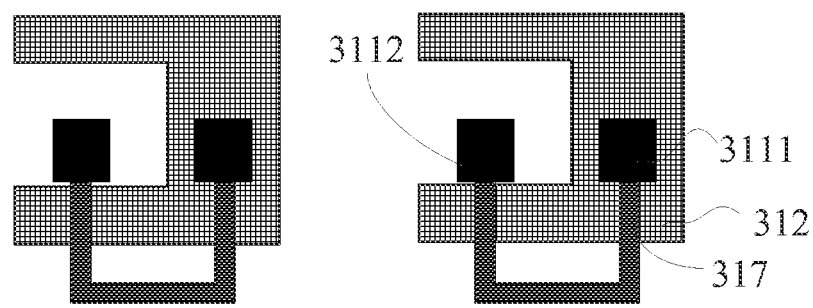
Figure 5C:
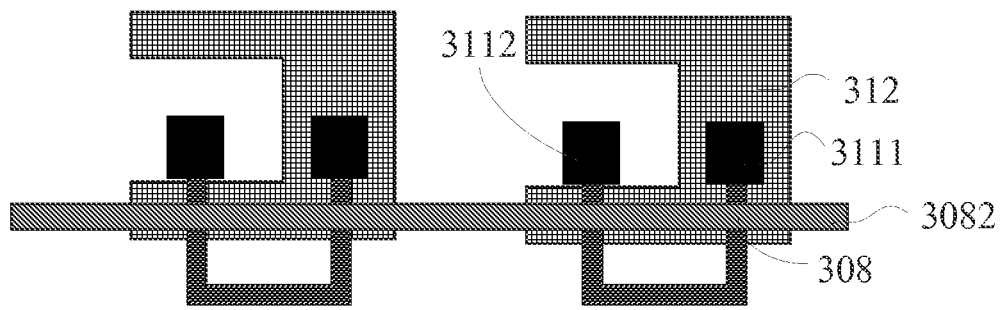
Figure 5D:
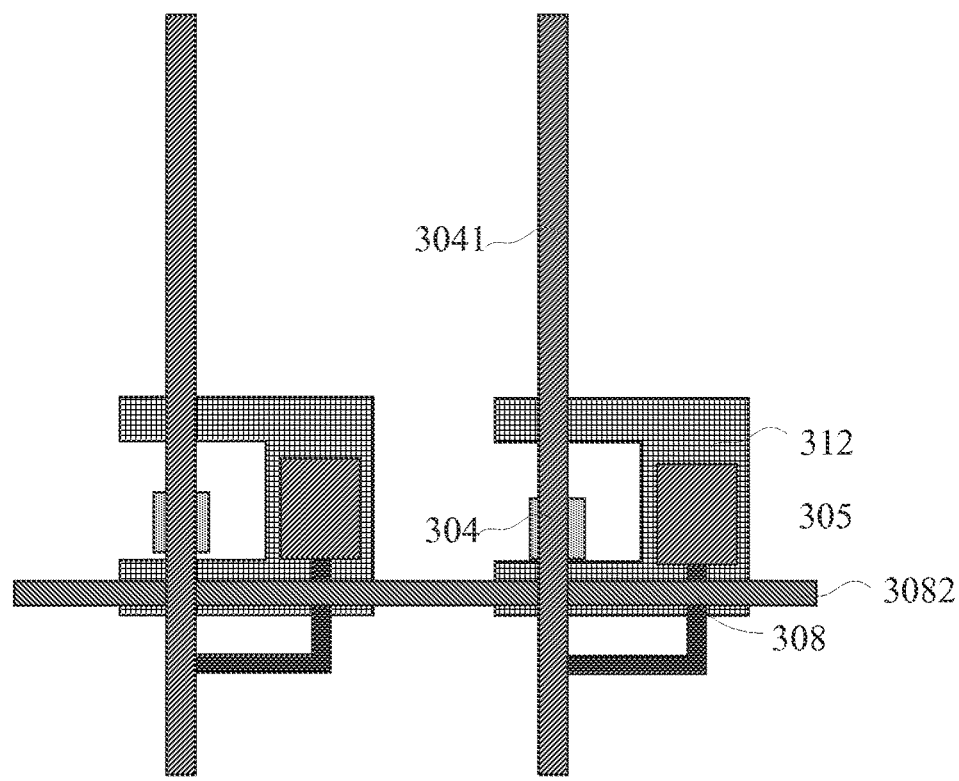
Figure 5E:
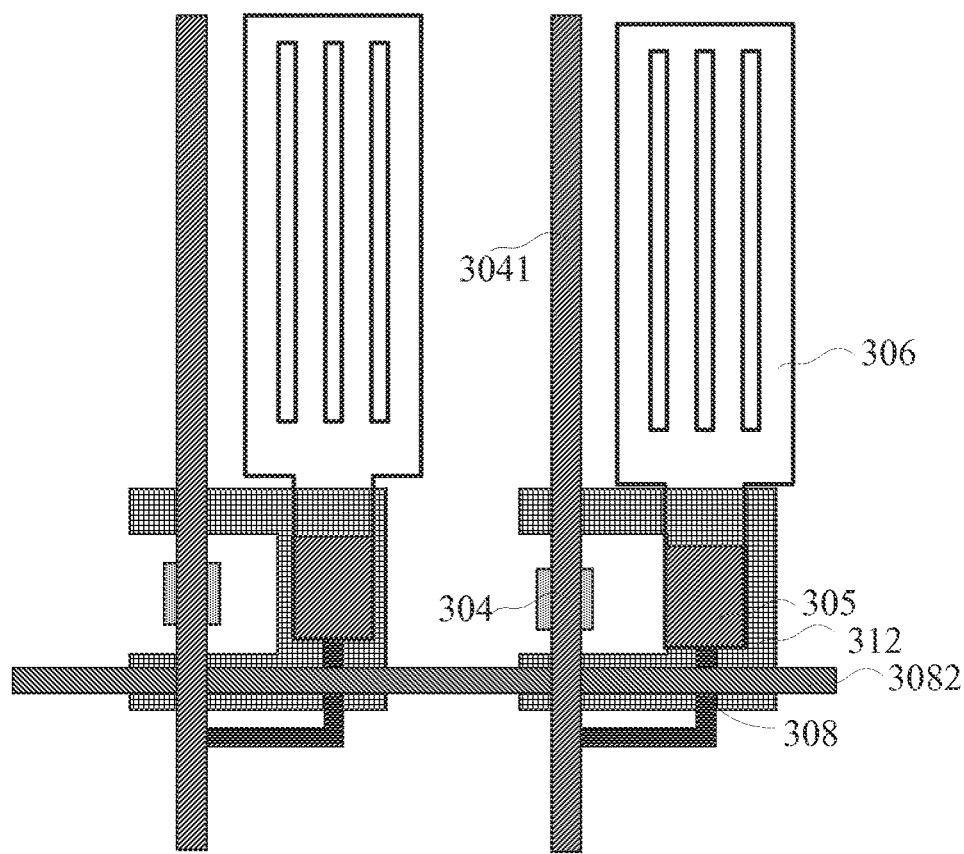
Figure 5F:
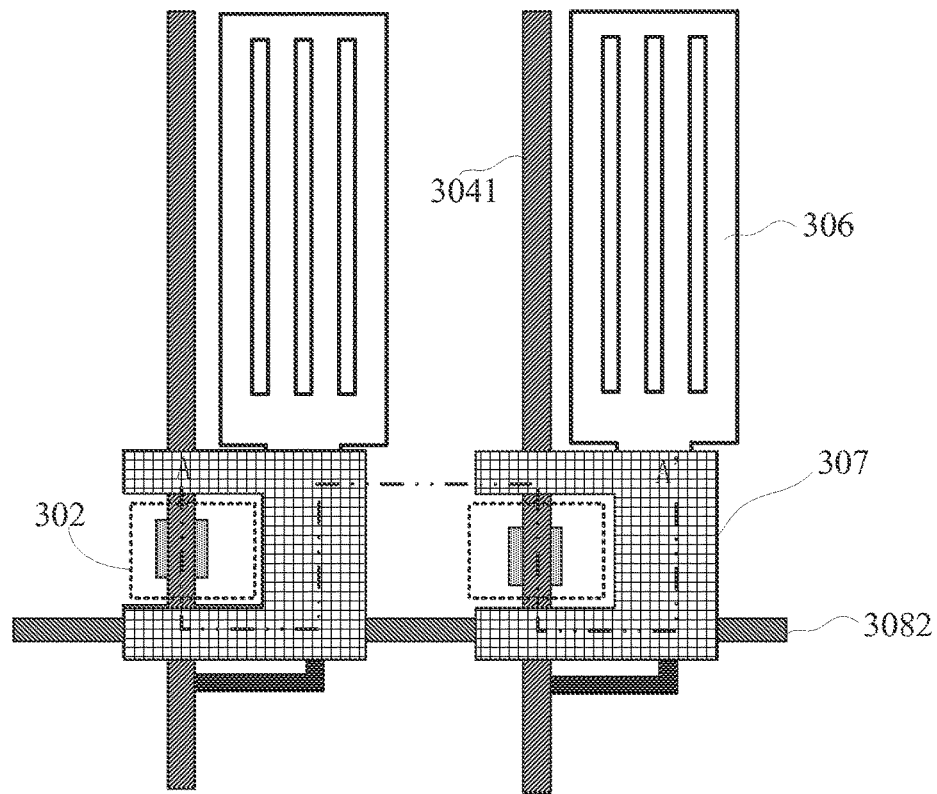
Figure 6:
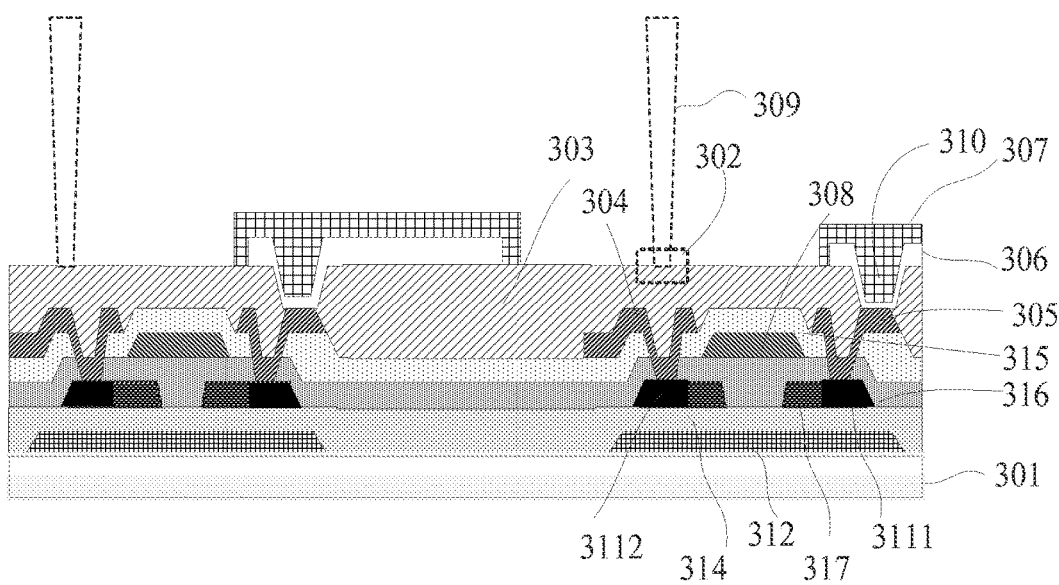
FIG. 6 illustrates a schematic diagram of a section in FIG. 5F taken along the AA' line.

Referring to FIG. 5A to FIG. 5F and FIG. 6, FIG. 5A to FIG. 5F illustrate top plan views of respective layers of a thin film transistor array substrate according to a second embodiment of the invention, and FIG. 6 illustrates a simplified cross-sectional view of a portion in FIG. 5F taken along the AA' line.

The thin film transistor array substrate further includes a U-shaped light shielding layer 312 arranged between a plurality of thin film transistors and a substrate 301 to overlap with drains 305 and channel areas 317 of the plurality of thin film transistors, and openings of the U-shaped light shielding layer 312 correspond to photo-sensitive spacer areas 302. It shall be noted that in another embodiment of the invention, the light shielding layer 312 can be another shape as long as the light shielding layer overlaps the drains and the channel areas but does not overlap the photo-sensitive spacer areas. The light shielding layer overlaps the channel areas to thereby avoid the channel areas from being illuminated by backlight, which would otherwise result in a leak current.

In the second embodiment of the invention, a second planarizing layer 307 has the same shape as that of the light shielding layer 312, and the location of the second planarizing layer 307 corresponds to the location of the light shielding layer 312. Since the second planarizing layer 307 has the same shape as that of the light shielding layer 312, and the location of second planarizing layer corresponds to the location the light shielding layer 312, and the light shielding layer 312 overlaps the drains 305 of the thin film transistors but does not overlap the photo-sensitive spacer areas 302, the second planarizing layer 401 can be filled into planarizing layer openings 310 arranged on the drains 305 to thereby planarize the planarizing layer openings 310, and the photo-sensitive spacer areas 302 remains its original first planarizing layer so that photo-sensitive spacers 309 can be arranged stably in the photo-sensitive spacer areas 302.

Preferably the thickness of the second planarizing layer 307 is between 0.1 and 10 micrometers, and when the photo-sensitive spacers 309 stand in the photo-sensitive spacer areas 302, each of the photo-sensitive spacers 309 can be held by the U-shaped second planarizing layer 307 to thereby stand more firmly.

The second embodiment of the invention further provides a liquid crystal display device including the thin film transistor array substrate as described above.

The second embodiment of the invention further provides a method of fabricating the thin film transistor array substrate, and preferably in the second embodiment of the invention, the second planarizing layer is exposed using a mask for forming a light shielding layer; and the exposed second planarizing layer is developed so that the second planarizing layer is left in an area corresponding to the light shielding layer, and the developed second planarizing layer is in the same shape as the light shielding layer.

Referring to FIG. 5A to FIG. 5F and FIG. 6, a method of fabricating the thin film transistor array substrate described above according to the second embodiment of the invention includes:

Step 1: provide a substrate 301 including multiple photo-sensitive spacer areas 302 and multiple planarizing layer opening areas, the photo-sensitive spacer areas 302 being in close proximity to the planarizing layer opening areas;

Step 2: deposit a light shielding layer material on the substrate 301; form a photo-resist layer on the light shielding layer material, and expose and develop the photo-resist using a light shielding layer mask and then etch the light shielding layer material to form a light shielding layer 312, the lighting shielding layer has such a shape to overlap drains and channel areas of a plurality of subsequently formed thin film transistors but does not overlap with the photo-sensitive spacer areas. In the second embodiment of the invention, the light shielding layer 312 is U-shaped and overlaps the subsequently formed drains and channel areas, and openings of the U-shaped light shielding layer 312 correspond to the photo-sensitive spacer areas 302;

Step 3: form a buffer layer 314 on the light shielding layer 312, the buffer layer 314 overlies the light shielding layer 312 and is typically made of silicon dioxide;

Step 4: form a poly-silicon layer on the buffer layer 314, the poly-silicon layer 314 includes source areas 3112, drain areas 3111, and channel areas 317 between the source areas 3112 and the drain areas 3111. The channel areas 317 and the drain areas 3111 overlap the light shielding layer 312; and as illustrated in FIG. 5B, in the second embodiment of the invention, the poly-silicon layer includes two channel areas 317 between which a wiring area is arranged not to overlap the light shielding layer 312. However, in another embodiment, a single channel area can be arranged without any wiring area;

Step 5: form a gate insulation layer 316 on the poly-silicon layer; form gate lines 3082 and gates 308 on the gate insulation layer 316, in FIG. 5C, the gates 308 are parts of the gate line 3082 overlapping the channel areas 317; and form an interlayer insulation layer 315 on the gate layer, the interlayer insulation layer 315 exposes the drains areas 3111 and the source areas 3112 of the poly-silicon layer;

Step 6: form sources 304, drains 305 and data lines 3041 above the interlayer insulation layer 315. The sources 304 are connected with the source areas 3112 of the poly-silicon layer, and the drains 305 are connected with the drain areas 3111 of the poly-silicon layer, and in this embodiment, the sources 304 are parts of the data lines 3041 connected with the source areas 3112.

Step 7: form a first planarizing layer 303 above the sources 304, the drains 305 and the data lines 3041, and planarizing layer openings 310 are arranged in the first planarizing layer 303 corresponding to planarizing layer opening areas, that is, the planarizing layer openings 310 are arranged in the first planarizing layer 303 in areas corresponding to the drains 305, wherein the drains 305 are exposed in the planarizing layer openings 310; and to form a pixel electrode layer 306 on the first planarizing layer 303, the pixel electrode layer 306 is in metal contact with the drains 305;

Step 8: coat a second planarizing layer material on the pixel electrode layer 306, and expose the second planarizing layer material using the light shielding layer mask and then develop the second planarizing layer material into a second planarizing layer 307, the second planarizing layer 307 has such a shape to overlap the drains 305 and the channel areas 317 of the plurality of thin film transistors but does not overlap with the photo-sensitive spacer areas 302. In this embodiment, the second planarizing layer 307 is U-shaped and overlaps the drains 305 and the channel areas 317, and openings of the U-shaped second planarizing layer 307 correspond to the photo-sensitive spacer areas 302.

In this embodiment, the second planarizing layer 307 overlaps with the drains 305 of the plurality of thin film transistors, that is, the second planarizing layer 307 can be filled into the planarizing layer openings 310 arranged on the drains 305 to thereby planarize the planarizing layer openings 310, and meantime the second planarizing layer 307 does not overlap with the photo-sensitive spacer areas 302 so that the photo-sensitive spacer areas 302 remains the original first planarizing layer being planarized, and photo-sensitive spacers 309 can be arranged stably in the photo-sensitive spacer areas 302. Moreover, the second planarizing layer can be exposed using the mask for forming the light shielding layer to thereby lower a cost of fabricating the mask.

It shall be noted that the fabricating method according to the second embodiment of the invention has been described taking the semiconductor layer which is a poly-silicon layer as an example, but alternatively an amorphous silicon or oxide semiconductor layer can be formed in another embodiment of the invention, and the operation of forming the semiconductor layer will not be limited in the embodiment of the invention.

Third Embodiment

Figure 7A:
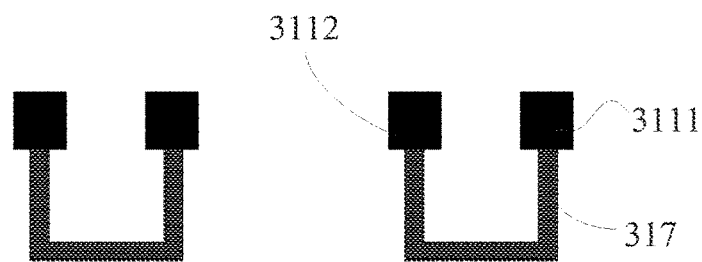
FIG. 7A to FIG. 7E illustrate top plan views of respective layers of a thin film transistor array substrate according to a third embodiment of the invention.
Figure 7B:
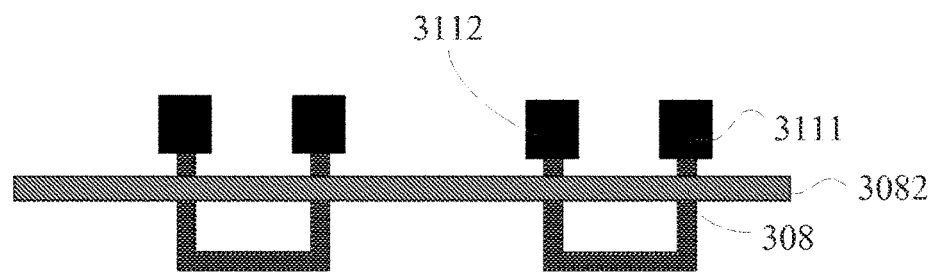
Figure 7C:
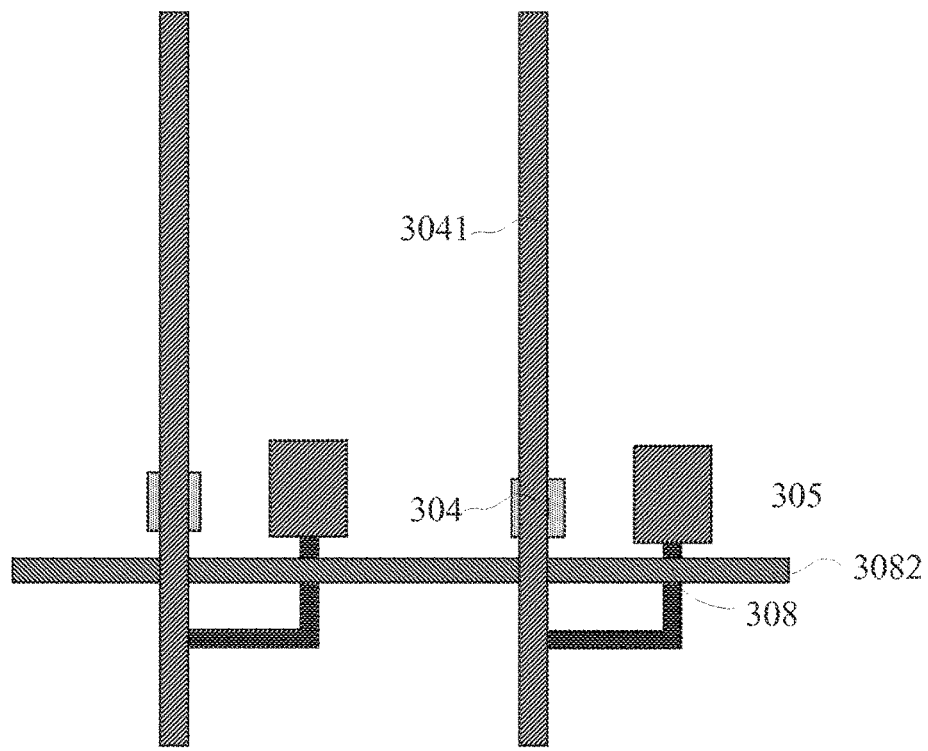
Figure 7D:
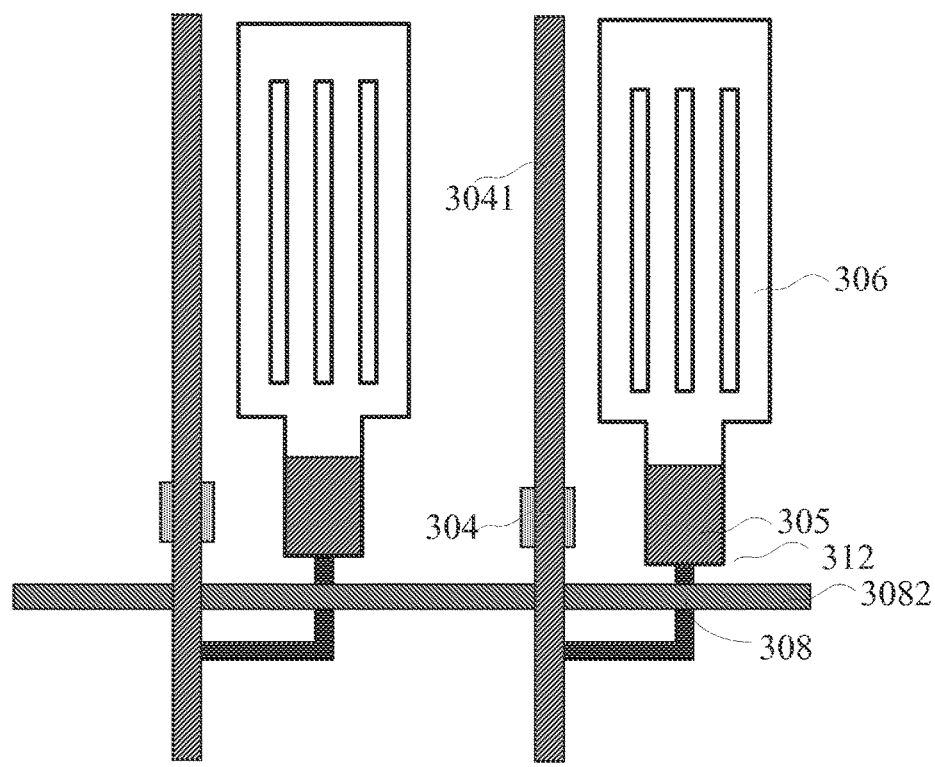
Figure 7E:
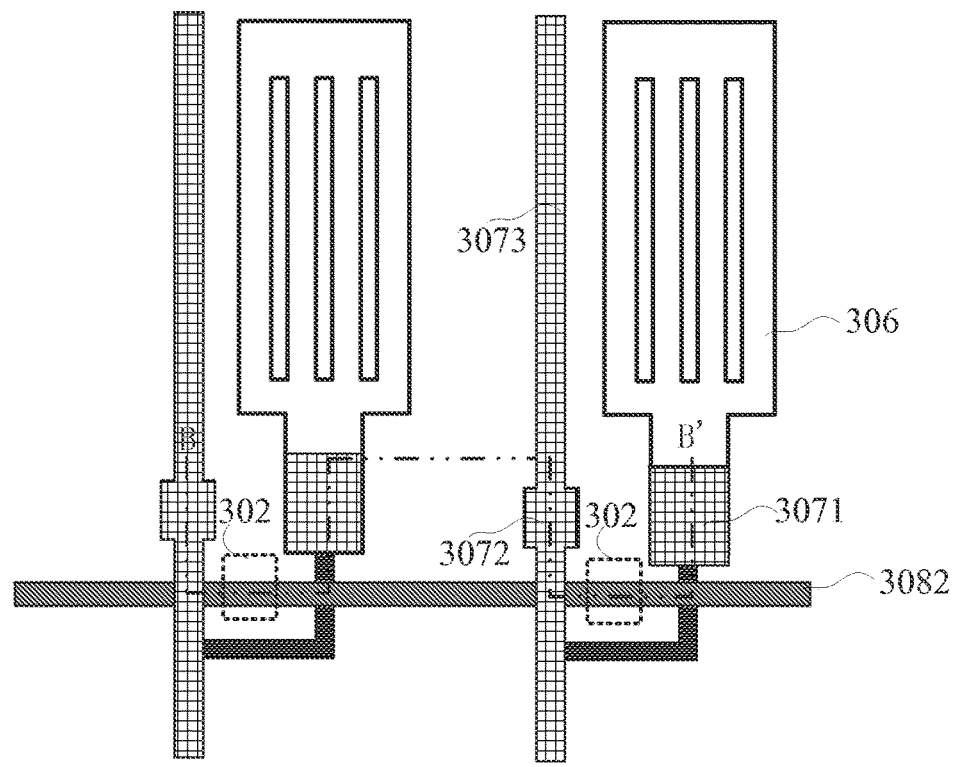
Figure 8:
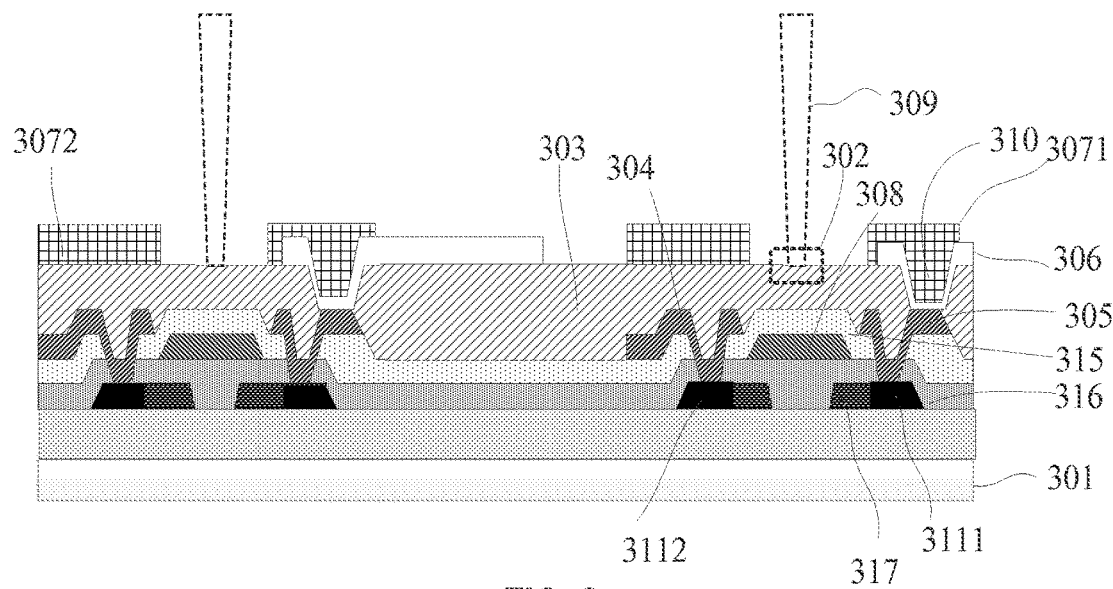
FIG. 8 illustrates a schematic diagram of a section in FIG. 7E taken along the BB' line.

Referring to FIG. 7A to FIG. 7E and FIG. 8, FIG. 7A to FIG. 7E illustrate top plan views of respective layers of a thin film transistor array substrate according to a third embodiment of the invention, and FIG. 8 illustrates a simplified sectional view of a portion in FIG. 7E taken along the BB' line.

Pixel electrodes 306 connected with drains 305 through planarizing layer openings 310 are arranged in areas on the thin film transistor array substrate surrounded by a plurality of data lines 3041 and a plurality of gate lines 3082. A second planarizing layer including first portions 3071, second portions 3072 and third portions 3073 is arranged above the pixel electrodes 306. The first portions 3071 of the second planarizing layer are in the same shape as the drains 305, and positioned at the locations corresponding to the drains 305, the second portions 3072 of the second planarizing layer are in the same shape as the sources 304, and positioned at the locations corresponding to the sources 304, and the third portions of the second planarizing layer are in the same shape as the data lines 3041, and positioned at the locations corresponding to the data lines 3041.

Photo-sensitive spacer areas 302 can be arranged above the gate lines 3082 or between the sources 304 and the drains 305.

In the third embodiment of the invention, since the planarizing layer openings 310 are filled with the first portions of the second planarizing layer corresponding to the drains 305, photo-sensitive spacers 309 stand in the photo-sensitive spacer areas 302 without slipping into the planarizing layer openings 310 to thereby better support a liquid crystal display. Preferably in order to fabricate stably the photo-sensitive spacers in the photo-sensitive spacer areas, the thickness of the second planarizing layer is in the range between 0.1 and 10 micrometers.

The third embodiment of the invention further provides a liquid crystal display device including the above-described thin film transistor array substrate.

The third embodiment of the invention further provides a method of fabricating the thin film transistor array substrate described above, and preferably the second planarizing layer is exposed using a mask used for forming other parts in a process of fabricating the thin film transistor array by exposing the second planarizing layer using a mask for forming sources and drains; and developing the exposed second planarizing layer to leave the second planarizing layer in the areas corresponding to the sources, drains and data lines.

Referring to FIG. 7A to FIG. 7E and FIG. 8, a method of fabricating the thin film transistor array substrate above according to the third embodiment of the invention includes:

Step 1: provide a substrate 301 including multiple photo-sensitive spacer areas 302 and multiple planarizing layer opening areas, the photo-sensitive spacer areas 302 being in close proximity to the planarizing layer opening areas;

Step 2: form a poly-silicon layer on the substrate 301, the poly-silicon layer includes source areas 3112, drain areas 3111, and channel areas 317 disposed between the source areas 3112 and the drain areas 3111;

Step 3: form a gate insulation layer 316 on the poly-silicon layer; form gate lines 3082 and gates 308 on the gate insulation layer 316, referring to FIG. 7B, the gates 308 are portions of the gate lines 3082 overlapping the channel areas 317; and form an interlayer insulation layer 315 on the gate layer, the interlayer insulation layer 315 exposes the drain areas 3111 and the source areas 3112 of the poly-silicon layer;

Step 4: deposit a source-drain metal layer material above the interlayer insulation layer 315; form a photo-resist layer on the source-drain metal layer material, expose and develop the photo-resist using a source-drain metal layer mask, and then etch the source-drain metal layer material into sources 304, drains 305 and data lines 3041. The sources 304 are connected with the source areas 3112 of the poly-silicon layer, and the drains 305 are connected with the drain areas 3111 of the poly-silicon layer, and in this embodiment, the sources 304 are portions of the data lines 3041 connected with the source areas 3112;

Step 5: form a first planarizing layer 303 above the sources 304, the drains 305 and the data lines 3041, and planarizing layer openings 310 are formed in the first planarizing layer 303 corresponding to planarizing layer opening areas, i.e., the drains 305, the drains 305 are exposed in the planarizing layer openings 310; and form a pixel electrode layer 306 on the first planarizing layer 303, the pixel electrode layer is in contact with the drains 305; and Step 6: coat a second planarizing layer material on the pixel electrode layer 306, and expose the second planarizing layer material using a source-drain metal layer mask and then develop the second planarizing layer material into a second planarizing layer, which includes first portions 3071 which are in the same shape as the drains 305 and positioned at the locations corresponding to the drains 305, second portions 3072 which are in the same shape as the sources 304, and positioned at the locations corresponding to the sources 304, and third portions 3073 which are in the same shape as the data lines 3041, and positioned at the locations corresponding to the data lines 3041.

In the method for fabricating a thin film transistor array substrate according to the third embodiment of the invention, the first portions 3071 of the second planarizing layer are in the same shape as the drains 305, and positioned at the locations corresponding to the drains 305, that is, the first portions 3071 of the second planarizing layer fill and planarize the planarizing layer openings 310, and the second planarizing layer is exposed using the source-drain metal layer mask, i.e., a mask for forming the sources and the drains, thus making the first planarizing layer more planar and also lowering a cost of fabricating the mask.

Fourth Embodiment

Figure 9A:
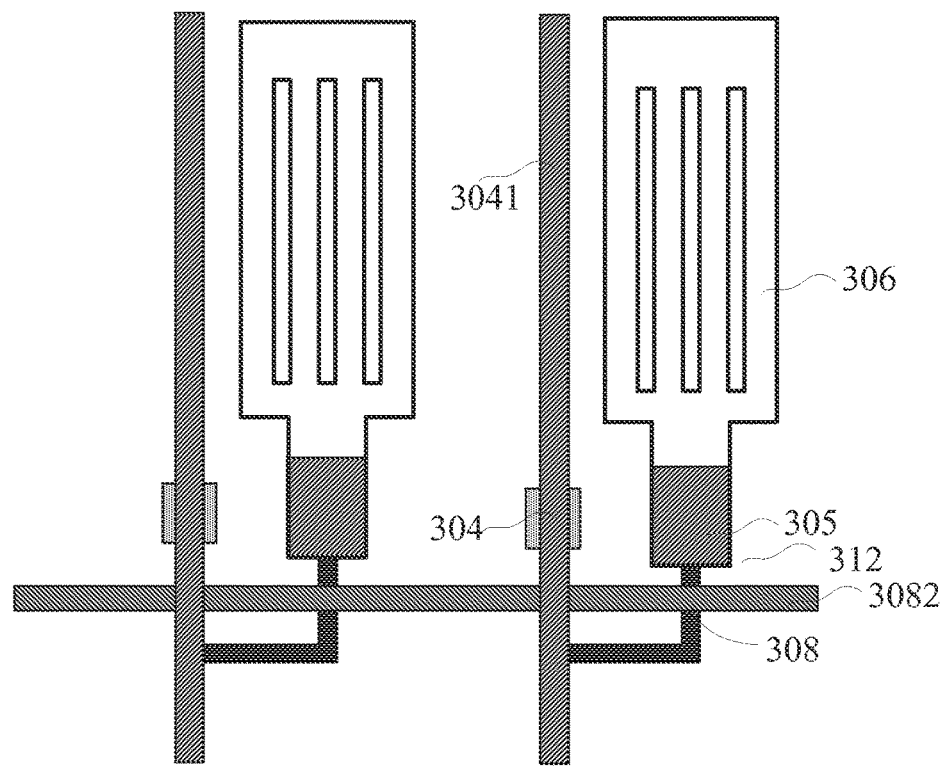
FIG. 9A and FIG. 9B illustrate top plan views of respective layers of a thin film transistor array substrate according to a fourth embodiment of the invention.
Figure 9B:
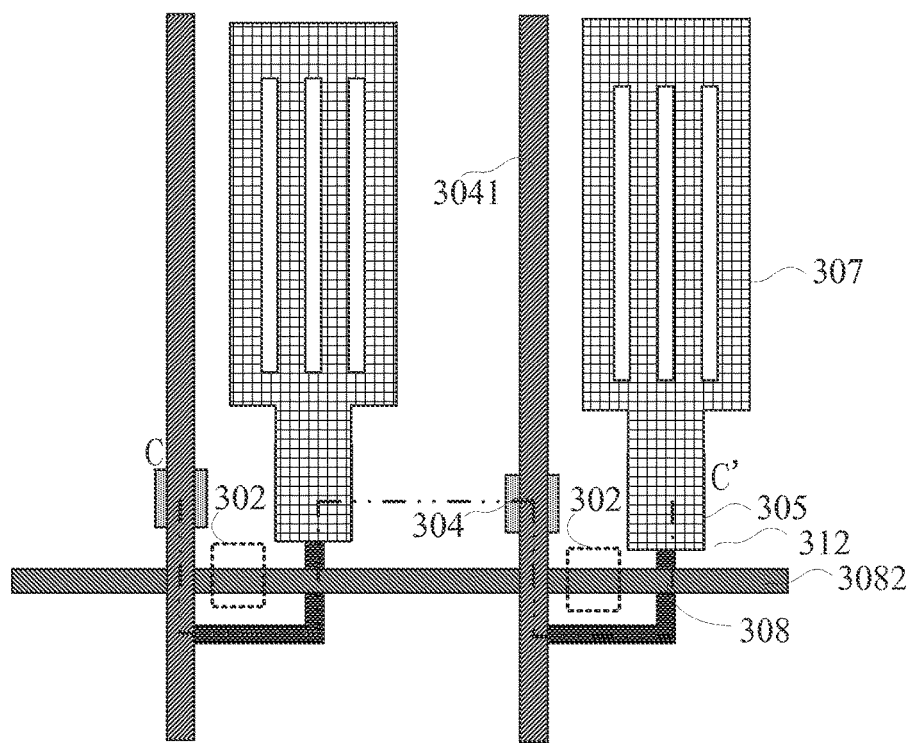
Figure 10:
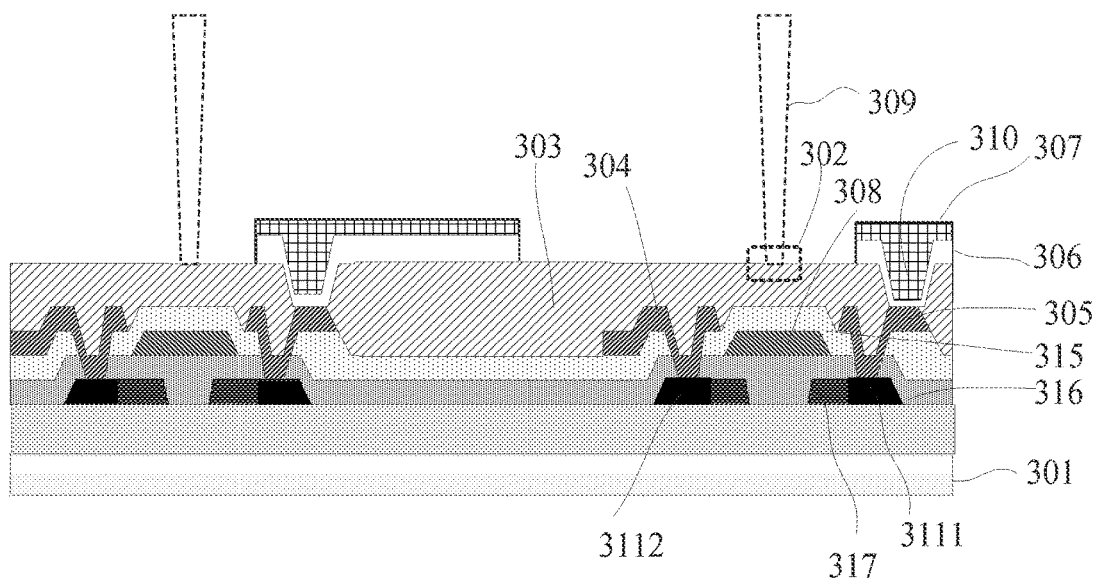
FIG. 10 illustrates a simplified sectional view of a portion in FIG. 9B taken along the CC' line.

Referring to FIG. 9A and FIG. 9B and FIG. 10, FIG. 9A and FIG. 9B illustrate top plan views of respective layers of a thin film transistor array substrate according to a fourth embodiment of the invention, and FIG. 10 illustrates a schematic diagram of a section in FIG. 9B taken along the CC' line.

The same aspects of the fourth embodiment of the invention in the structures according to the first to third embodiments of the invention will not be described again, and its differences lies in that in the fourth embodiment of the invention, the second planarizing layer 307 arranged on the pixel electrode layer 306 is in the same shape as the pixel electrode layer 306, and the location of the second planarizing layer 307 corresponds to the location of the pixel electrode layer 306. As can be seen from FIG. 9B and FIG. 10, the second planarizing layer 307 overlies an area including an area of the pixel electrode layer 306 in contact with the drains 305, that is, the second planarizing layer 307 fills the planarizing layer openings 310, so the photo-sensitive spacer fabricated on the thin film transistor array substrate will not slip into the planarizing layer openings 310. In the thin film transistor array substrate, the photo-sensitive spacer areas 302 can be arranged above the gate lines 3082 or in corresponding areas between the sources 304 and the drains 305.

The fourth embodiment of the invention further provides a liquid crystal display device including the thin film transistor array substrate above.

The fourth embodiment of the invention further provides a method of fabricating the thin film transistor array substrate above, and preferably the second planarizing layer is exposed using a mask used for forming other parts in a process of the thin film transistor array by exposing the second planarizing layer using a mask for forming a pixel electrode layer; and developing the exposed second planarizing layer to leave the second planarizing layer in the pixel electrode layer area.

Step 1 to step 5 in the method for fabricating a thin film transistor array substrate according to the fourth embodiment of the invention are the same as step 1 to step 5 in the fabricating method according to the first embodiment of the invention, so a repeated description thereof will be omitted here, and its difference lies in the following:

Step 6 is to expose the second planarizing layer using a pixel electrode layer mask and to develop the exposed second planarizing layer so that the second planarizing layer is left in the pixel electrode layer area, the second planarizing layer 307 is in the same shape as the pixel electrode layer 306, and the location of the second planarizing layer 307 corresponds to the location of the pixel electrode layer 306.

In the fourth embodiment of the invention, the second planarizing layer can be exposed using the mask for forming the pixel electrode layer so that the exposed second planarizing layer fills the planarizing layer openings, and also the first planarizing layer can be made more planar while lowering the fabrication cost of the mask.

Fifth Embodiment

Figure 11:
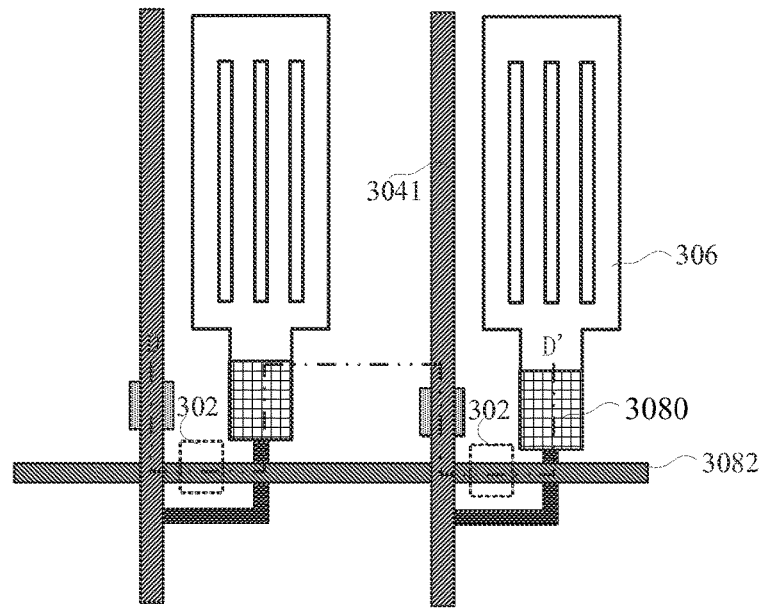
FIG. 11 illustrates a top plan view of a thin film transistor array substrate according to a fifth embodiment of the invention.
Figure 12:
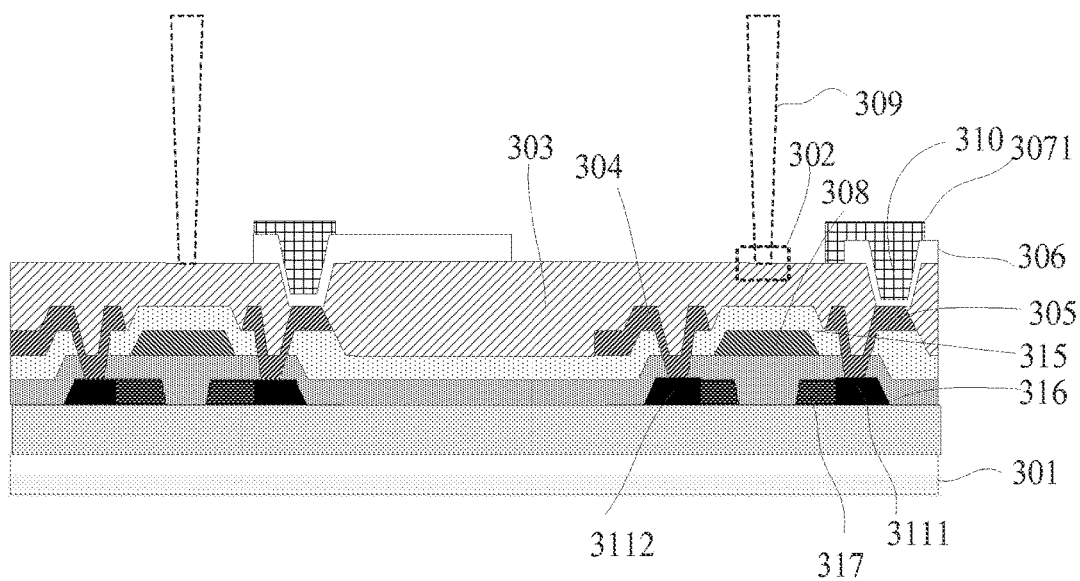
FIG. 12 illustrates a simplified sectional view of a portion in FIG. 11 taken along the DD' line.

FIG. 11 illustrates a top plan view of a thin film transistor array substrate according to a fifth embodiment of the invention, and FIG. 12 illustrates a simplified sectional view of a portion in FIG. 11 taken along the DD' line. In the fifth embodiment of the invention, the second planarizing layer 3071 is in the same shape as the areas where the drains 305 overlap the pixel electrode layer 306, and the location of the second planarizing layer 3080 corresponds to the location of the areas where the drains 305 overlap the pixel electrode layer 306. The second planarizing layer 3071 fills the planarizing layer openings 310, so the photo-sensitive spacers formed on the thin film transistor array substrate will not slip into the planarizing layer openings 310.

The fifth embodiment of the invention further provides a liquid crystal display device including the thin film transistor array substrate above.

The fifth embodiment of the invention further provides a method of fabricating the thin film transistor array substrate above, and the operation 1 to the operation 5 in the method for fabricating a thin film transistor array substrate according to the fifth embodiment of the invention are the same as the operation 1 to the operation 5 in the fabricating method according to the first embodiment of the invention, so a repeated description thereof will be omitted here, and referring to FIG. 11 and FIG. 12, its difference lies in the following:

Step 6 is to expose the second planarizing layer material using a mask for forming a pixel electrode layer;

Step 7 is to expose the second planarizing layer material exposed in the operation 6 again using a mask for forming the sources and the drains; and Step 8 is to develop the second planarizing layer exposed twice so that the second planarizing layer 3071 is left in the areas where the drains 305 overlap with the pixel electrode layer 306, the areas where the drains 305 overlap with the pixel electrode layer 306 are the areas of the planarizing layer openings 310, and the second planarizing layer 3071 fills the planarizing layer openings 310.

Optionally, in another embodiment, the method for fabricating a thin film transistor array substrate according to the fifth embodiment of the invention can alternatively include:

Step 6 is to expose the second planarizing layer material using a mask for forming the sources and the drains;

Step 7 is to expose the second planarizing layer material exposed in the operation 6 again using a mask for forming a pixel electrode layer; and Step 8 is to develop the second planarizing layer exposed twice so that the second planarizing layer 3071 is left in the areas where the drains 305 overlap with the pixel electrode layer 306, the areas where the drains 305 overlap with the pixel electrode layer 306 are the areas of the planarizing layer openings 310, and the second planarizing layer 3071 fills the planarizing layer openings 310.

In the third embodiment of the invention, after the second planarizing layer are exposed using the mask for the sources and the drains, the second planarizing layer corresponding to the drain areas fills the planarizing layer openings 310, but the second planarizing layer corresponding to the source and data line areas may be unnecessary to the structure of the thin film transistor array substrate. In the fourth embodiment of the invention, after the second planarizing layer is exposed using the mask of the pixel electrode layer, the second planarizing layer at the locations where the drains are connected with the pixel electrodes fills the planarizing layer openings 310, and the remaining second planarizing layer may be unnecessary but degrade the transmittivity of the thin film transistor array substrate.

In the fabricating method according to the fifth embodiment of the invention, with the two exposure processes, the second planarizing layer overlapping with the drains 305 and the pixel electrode layer 306 is left to fill the planarizing layer openings while remaining second planarizing layer in the non-filling area is removed.

Sixth Embodiment

Figure 13:
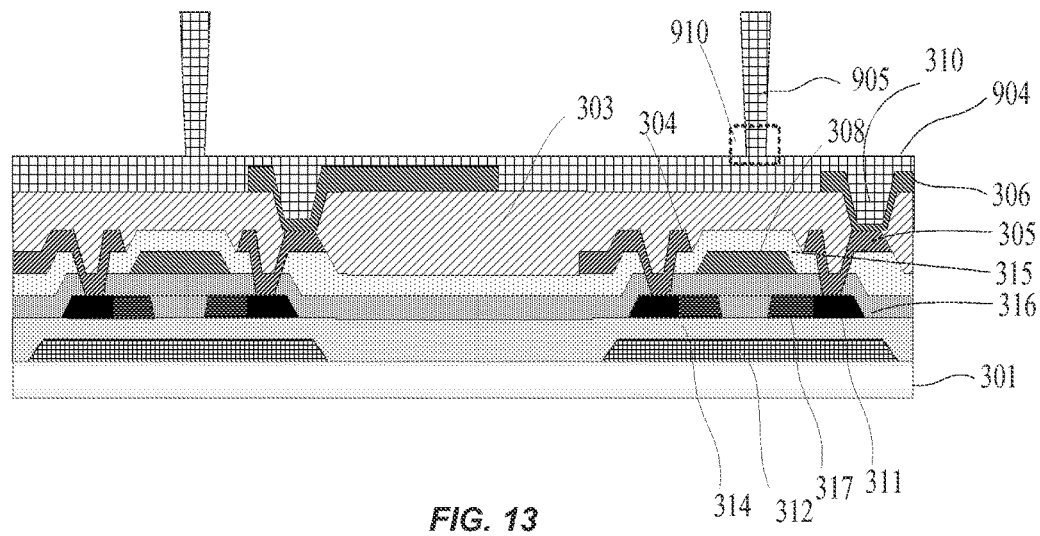
FIG. 13 illustrates a simplified sectional view of a thin film transistor array substrate according to a sixth embodiment of the invention.

FIG. 13 illustrates a sectional view of a thin film transistor array substrate according to a sixth embodiment of the invention. In FIG. 13, the thin film transistor array substrate includes: a substrate 301 including multiple photo-sensitive spacer areas 910 and multiple planarizing layer opening areas, the photo-sensitive spacer areas 910 being in close proximity to the planarizing layer opening areas, and a plurality of thin film transistors arranged on the substrate 301, each of which includes a source 304 and a drain 305; a first planarizing layer 303 arranged on the plurality of thin film transistors; planarizing layer openings 310 arranged in the first planarizing layer 303 corresponding to the planarizing layer opening areas, that is, planarizing layer openings 310 arranged in the first planarizing layer 303 corresponding to the drains 305, the drains 305 are exposed in the planarizing layer openings 310; a pixel electrode layer 306 arranged on the first planarizing layer 303 and in metal contact with the drains 305; and a second planarizing layer 904 arranged on the pixel electrode layer 306 and filling the planarizing layer openings 310, and photo-sensitive spacers 905 formed in the photo-sensitive spacer areas 910. Preferably the thickness of the second planarizing layer is in the range between 0.1 and 10 micrometers.

A light shielding layer 312 is further arranged on the substrate 301, and a buffer layer 314 made of typically silicon dioxide is arranged on the light shielding layer 312. A poly-silicon layer 311 is arranged above the buffer layer 314, the sources 304 and the drains 305 are typically connected through the poly-silicon layer 311, and channel areas 317 are further arranged between the sources 304 and the drains 305. A gate insulation layer 316 is arranged between the channel areas 317 and gates 308, and an interlayer insulation layer 315 is arranged between the gates 308 and the first planarizing layer 303. Photo-sensitive spacers 309 are formed in the photo-sensitive spacer areas.

The sixth embodiment of the invention further provides a liquid crystal display device including the thin film transistor array substrate above described.

The sixth embodiment of the invention further provides a method of fabricating the thin film transistor array substrate. Referring to FIG. 13, the method includes:

providing a substrate 301 including photo-sensitive spacer areas 910 and planarizing layer opening areas, the photo-sensitive spacer areas 910 being close to the planarizing layer opening areas;

forming a plurality of thin film transistors on the substrate 301, each of the thin film transistors includes a source 304 and a drain 305;

forming a first planarizing layer 303 on the plurality of thin film transistors, and etching the first planarizing layer 303 overlying areas of the drains 305 to form a plurality of planarizing layer openings 310 in the planarizing layer opening areas, the planarizing layer openings 310 exposing the drains 305;

forming a pixel electrode layer 306 on the first planarizing layer 303, the pixel electrode layer 306 is in contact with the drains 305 through the planarizing layer openings 310; and forming a second planarizing layer 904 on the pixel electrode layer 306, the second planarizing layer 904 filling the planarizing layer openings 310 and having a thickness equal to the height of photo-sensitive spacers; and exposing the second planarizing layer 904 using a mask to form the second planarizing layer in the photo-sensitive spacer areas 910 and at the sources 304 and the drains 305 of the plurality of thin film transistors; and the second planarizing layer in the photo-sensitive spacer areas 910 forms into the photo-sensitive spacer 905.

In the sixth embodiment of the invention, with the exposure, development and other processes, the second planarizing layer with a thickness between 1 and 10 micrometers is formed on the first planarizing layer, and the second planarizing layer in the photo-sensitive spacer areas forms into the photo-sensitive spacers, so that the photo-sensitive spacers can be fabricated at the same time as the planarizing layer openings on the first planarizing layer are filled to thereby save the process operations. Moreover the surface of the fabricated second planarizing layer is planar so that the photo-sensitive spacers will not be inclined or slip into the planarizing layer openings when an external force is applied thereto.

Preferably, the second planarizing layer is cured at a temperature of 230° C. for 30 minutes so that the second planarizing layer reacts with oxygen plasmas to form a planar surface thereof. The second planarizing layer treated with the oxygen plasmas has some roughness which facilitates attachment of an alignment material to thereby suppress effectively an alignment layer from being falling off and alleviate conglomeration and protruding of the alignment layer.

Seventh Embodiment

Figure 14:
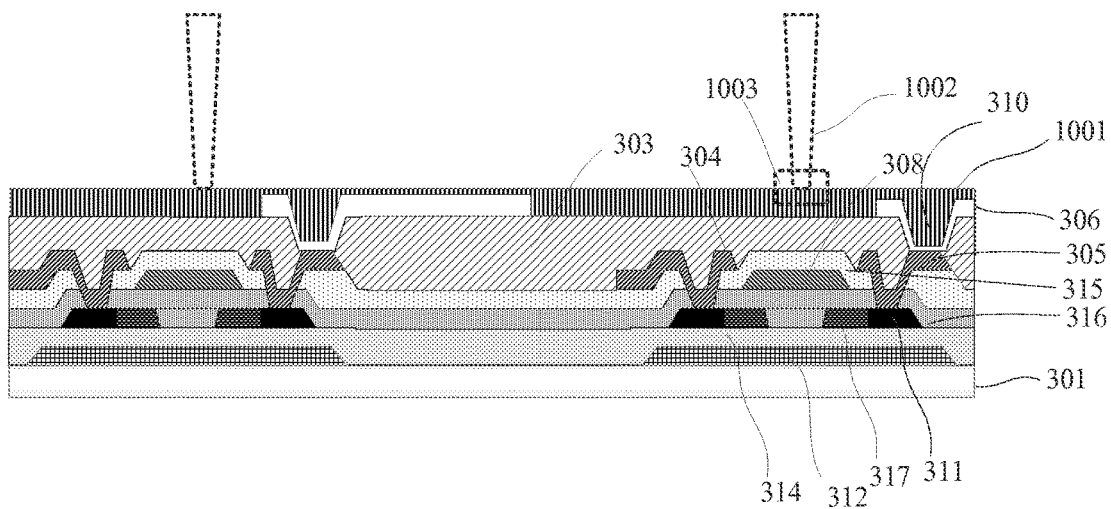
FIG. 14 illustrates a simplified sectional view of a thin film transistor array substrate according to a sixth embodiment of the invention.

FIG. 14 illustrates a sectional view of a thin film transistor array substrate according to a seventh embodiment of the invention. The thin film transistor array substrate includes: a substrate 301 including photo-sensitive spacer areas 1003 and planarizing layer opening areas, the photo-sensitive spacer areas 1003 are close to the planarizing layer opening areas, and a plurality of thin film transistors arranged on the substrate 301, each of which includes a source 304 and a drain 305; a first planarizing layer 303 arranged on the plurality of thin film transistors; planarizing layer openings 310 arranged in the first planarizing layer 303 corresponding to the planarizing layer opening areas, that is, the planarizing layer openings 310 arranged in the first planarizing layer 303 corresponding to the drains 305, which are exposed in the planarizing layer openings 310; a pixel electrode layer 306 arranged on the first planarizing layer 303 and in metal contact with the drains 305; and a second planarizing layer 1001 arranged on the pixel electrode layer 306, the second planarizing layer 1001 filling the planarizing layer openings 310 and the photo-sensitive spacer areas. Photo-sensitive spacers 1002 are formed in the photo-sensitive spacer areas 1003.

A light shielding layer 312, and a buffer layer 314 overlying the light shielding layer 312 are arranged on the substrate 301, the buffer layer are typically made of silicon dioxide. A poly-silicon layer 311 is arranged above the buffer layer 314, the sources 304 and the drains 305 are typically connected through the poly-silicon layer 311, and channel areas 317 are further arranged between the sources 304 and the drains 305. A gate insulation layer 316 is arranged between the channel areas 317 and gates 308, and an interlayer insulation layer 315 is arranged between the gates 308 and the first planarizing layer 303.

The seventh embodiment of the invention further provides a liquid crystal display device including the thin film transistor array substrate described above.

The seventh embodiment of the invention further provides a method of fabricating the thin film transistor array substrate, and referring to FIG. 14, the method includes:

providing a substrate 301 including photo-sensitive spacer areas 1003 and planarizing layer opening areas, the photo-sensitive spacer areas 910 being close to the planarizing layer opening areas;

forming a plurality of thin film transistors on the substrate 301, each of which includes a source 304 and a drain 305;

forming a first planarizing layer 303 on the plurality of thin film transistors, and the first planarizing layer 303 overlying areas of the drains 305 is etched to form planarizing layer openings 310 which expose the drains 305;

forming a pixel electrode layer 306 on the first planarizing layer 303, the pixel electrode layer 306 is in contact with the drains 305 through the planarizing layer openings 310; and forming a second planarizing layer 1001 on the pixel electrode layer 306 to fill the planarizing layer openings 310.

In the embodiment above of the invention, since the second planarizing layer overlies the entire first planarizing layer, that is, the second planarizing layer overlies the pixel electrode layer and the planarizing layer openings on the first planarizing layer, thus the fabricated photo-sensitive spacers stand on the planar second planarizing layer, so that the stably standing photo-sensitive spacers can be fabricated to thereby address the problems of deformation, color cast, light leakage, etc., of the liquid crystal display due to the abnormally positioned photo-sensitive spacers.

The thin film transistor array substrates according to the first embodiment to the seventh embodiment of the invention can accommodate a high definition of the display and alleviate the problems of color cast, light leakage, etc., of the display being pressed.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

What is claimed is:

1. A method of fabricating a thin film transistor array substrate, the method comprising:
   providing a substrate comprising a plurality of photo-sensitive spacer areas and a plurality of planarized layer opening areas, the photo-sensitive spacer areas being in close proximity to the planarized layer opening areas;
   forming a plurality of thin film transistors on the substrate, each of the plurality of thin film transistors comprises a source and a drain;
   patterning a light shielding layer on the substrate between the plurality of thin film transistors and the substrate using a mask, wherein the light shielding layer overlaps the drains and channel areas of the plurality of thin film transistors but does not overlap the photo-sensitive spacer areas;
   forming a first planarized layer over the plurality of thin film transistors;
   etching the first planarized layer to form a plurality of planarized layer openings wherein the said openings expose the drains of the plurality of thin film transistors;
   forming a pixel electrode layer on the first planarized layer, wherein the pixel electrode layer contacts the drains through the planarized layer openings but only partially fills the said openings;
   forming a second planarized layer on the pixel electrode layer, wherein the second planarized layer fills the planarized layer openings;
   patterning the second planarized layer using the same mask for the light shielding layer to form a portion of the second planarized layer in an area corresponding to the light shielding layer; and
   removing a remaining portion of the second planarized layer in the photo-sensitive spacer areas.

2. The method according to claim 1, wherein the mask for forming the light shielding layer has a U shaped pattern; and
   the second planarized layer is exposed using the mask for forming the light shielding layer to form the second planarized layer with the U-shaped pattern, and in the second planarized layer with the U-shaped pattern, openings of the U-shaped pattern are arranged in the photo-sensitive spacer areas.

3. A method of fabricating a thin film transistor array substrate, the method comprising:
   providing a substrate comprising a plurality of photo-sensitive spacer areas and a plurality of planarized layer opening areas, the photo-sensitive spacer areas being in close proximity to the planarized layer opening areas;
   forming a plurality of thin film transistors on the substrate, each of the plurality of thin film transistors comprises a source and a drain;
   forming a first planarized layer over the plurality of thin film transistors;
   etching the first planarized layer to form a plurality of planarized layer openings, wherein the said openings expose the drains of the plurality of thin film transistors;
   forming a pixel electrode layer on the first planarized layer, wherein the pixel electrode layer contacts the drains through the planarized layer openings but only partially fills the said openings;
   forming a second planarized layer on the pixel electrode layer, wherein the second planarized layer fills the planarized layer openings;
   patterning the second planarized layer using the same mask for the sources and the drains
   to form the second planarized layer in areas corresponding to the sources and drains; and
   removing a remaining portion of the second planarized layer in the photo-sensitive spacer areas.

4. A method of fabricating a thin film transistor array substrate, the method comprising:
   providing a substrate comprising a plurality of photo-sensitive spacer areas and a plurality of planarized layer opening areas, the photo-sensitive spacer areas being in close proximity to the planarized layer opening areas;
   forming a plurality of thin film transistors on the substrate, each of the plurality of thin film transistors comprises a source and a drain;
   forming a first planarized layer over the plurality of thin film transistors;
   etching the first planarized layer to form a plurality of planarized layer openings, wherein the said openings expose the drains of the plurality of thin film transistors;
   forming a pixel electrode layer on the first planarized layer, wherein the pixel electrode layer contacts the drains through the planarized layer openings but only partially fills the said openings;
   forming a second planarized layer on the pixel electrode layer, wherein the second planarized layer fills the planarized layer openings;
   patterning the second planarized layer using the same mask for the pixel electrode layer
   to form the second planarized layer in an area corresponding to the pixel electrode layer; and
   removing a remaining portion of the second planarized layer in the photo-sensitive spacer areas.

5. A thin film transistor array substrate, comprising:
   a substrate comprising a plurality of photo-sensitive spacer areas and a plurality of planarized layer opening areas, the photo-sensitive spacer areas being in close proximity to the planarized layer opening areas;

a plurality of thin film transistors arranged on the substrate, each of the plurality of thin film transistors comprising a source and a drain;

a light shielding layer arranged between the plurality of thin film transistors and the substrate, wherein the light shielding layer overlaps the sources, the drains of the plurality of thin film transistors and channel areas disposed between the sources and the drains of the plurality of thin film transistors;

a first planarized layer arranged on the plurality of thin film transistors and overlying the plurality of thin film transistors, wherein the planarized layer openings are arranged in the first planarized layer corresponding to the planarized layer opening areas, the planarized layer openings expose the drains;

a pixel electrode layer arranged on the first planarized layer, wherein the pixel electrode layer contacts the drains through the planarized layer openings but only partially fills the said openings; and a second planarized layer arranged on the pixel electrode layer and filling the planarized layer openings, wherein the second planarized layer is in a same shape as the light shielding layer, and a location of the second planarized layer corresponds to a location of the light shielding layer.

6. The thin film transistor array substrate according to claim 5, wherein the light shielding layer and the second planarized layer have a U-shaped pattern, openings of the U-shaped pattern are arranged in the photo-sensitive spacer areas.

7. A thin film transistor array substrate, comprising:
a substrate comprising a plurality of photo-sensitive spacer areas and a plurality of planarized layer opening areas, the photo-sensitive spacer areas being in close proximity to the planarized layer opening areas;

a plurality of thin film transistors arranged on the substrate, each of the plurality of thin film transistors comprising a source and a drain;

a first planarized layer arranged on the plurality of thin film transistors, wherein the planarized layer openings are arranged in the first planarized layer corresponding to the planarized layer opening areas, the planarized layer openings expose the drains;

a pixel electrode layer arranged on the first planarized layer, wherein the pixel electrode layer contacts the drains through the planarized layer openings but only partially fills the said openings; and a second planarized layer arranged on the pixel electrode layer and filling the planarized layer openings, wherein the second planarized layer is in a same shape as the sources, the drains and data lines, and a location of the second planarized layer corresponds to locations of the sources, the drains and the data lines.

8. A thin film transistor array substrate, comprising:
a substrate comprising a plurality of photo-sensitive spacer areas and a plurality of planarized layer opening areas, the photo-sensitive spacer areas being in close proximity to the planarized layer opening areas;

a plurality of thin film transistors arranged on the substrate, each of the plurality of thin film transistors comprising a source and a drain;

a first planarized layer arranged on the plurality of thin film transistors, wherein the planarized layer openings are arranged in the first planarized layer corresponding to the planarized layer opening areas, the planarized layer openings expose the drains;

a pixel electrode layer arranged on the first planarized layer, wherein the pixel electrode layer contacts the drains through the planarized layer openings but only partially fills the said openings; and a second planarized layer arranged on the pixel electrode layer and filling the planarized layer openings, wherein the second planarized layer is in a same shape as the pixel electrode layer, and a location of the second planarized layer corresponds to a location of the pixel electrode layer.

9. The thin film transistor array substrate according to claim 5, wherein the second planarized layer overlies the first planarized layer.

10. A liquid crystal display device, comprising the thin film transistor array substrate according to claim 5, and a color filter substrate, the thin film transistor array substrate and the color filter substrate being sealed and arranged opposite to each other, a liquid crystal layer disposed between the thin film transistor array substrate and the color filter substrate, a plurality of photo-sensitive spacers arranged between the thin film transistor array substrate and the color filter substrate in the photo-sensitive spacer areas.

* * * * *